(12) United States Patent
Morisada

(10) Patent No.: US 6,937,317 B2
(45) Date of Patent: Aug. 30, 2005

(54) ACTIVE DAMPING APPARATUS, EXPOSURE APPARATUS AND DEVICE MANUFACTURING METHOD

(75) Inventor: Masahiro Morisada, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/412,315

(22) Filed: Apr. 14, 2003

(65) Prior Publication Data

US 2003/0197845 A1 Oct. 23, 2003

(30) Foreign Application Priority Data

Apr. 19, 2002 (JP) ........................................ 2002-118003

(51) Int. Cl.[7] ........................ G03B 27/42; G03B 27/62; G03B 27/58
(52) U.S. Cl. ............................... 355/53; 355/75; 355/72
(58) Field of Search ............................. 355/75, 53, 72; 378/34, 204; 310/12; 318/687, 560

(56) References Cited

U.S. PATENT DOCUMENTS

| | | | |
|---|---|---|---|
| 5,936,710 A | 8/1999 | Itoh et al. ....................... 355/53 |
| 6,160,612 A | 12/2000 | Itoh et al. ....................... 355/53 |
| 6,408,045 B1 * | 6/2002 | Matsui et al. .................. 378/34 |
| 2002/0140921 A1 | 10/2002 | Morisada ....................... 355/73 |

FOREIGN PATENT DOCUMENTS

JP            11-264444            9/1999

* cited by examiner

*Primary Examiner*—Peter B. Kim
(74) *Attorney, Agent, or Firm*—Fitzpatrick, Cella, Harper & Scinto

(57) ABSTRACT

An active damping apparatus including an isolation table mounting a stage and a counter-mass, an isolation table controller operatively connected to the isolation table for supporting the isolation table and adjusting a position and an attitude of the isolation table, a setting unit operatively connected to the controller and adapted to select a combination of the stage and/or the counter-mass to be driven and to set a drive control mode according to what is to be driven, and a control input switch operatively connected to the setting unit and adapted to select a control loop that inputs into the isolation table controller a control target value for adjusting the drive of that which is to be driven according to the drive control mode selected by the setting unit. The active damping apparatus damps vibration by driving the stage and/or counter-mass mounted on the isolation table so as to offset a drive reaction torque and a counter-mass movement moment.

14 Claims, 11 Drawing Sheets

ACTIVE DAMPING APPARATUS, EXPOSURE APPARATUS AND DEVICE MANUFACTURING METHOD

FIELD OF THE INVENTION

The present invention relates to an improved active damping apparatus, an exposure apparatus and a device manufacturing method, and more particularly, to an active damping apparatus used in an exposure apparatus for imprinting a reticle circuit pattern onto a semiconductor wafer as well as a device manufacturing method employing the exposure apparatus equipped with the active damping apparatus for the manufacture of semiconductor devices.

BACKGROUND OF THE INVENTION

Conventionally, in an exposure apparatus used in the manufacture of semiconductor devices, the XY stage is mounted atop a vibration-free device. Generally, these vibration-free devices are of two types: passive vibration-absorbing systems, using air springs, coil springs, vibration-proof rubber, or the like, to attenuate vibration, and active vibration-damping systems that drive an actuator such as a voice coil motor.

However, vibration-free devices equipped with the passive vibration-absorbing systems described above, though they may be able to attenuate vibrations transmitted through the floor of the apparatus to some extent, are unable to effectively attenuate vibrations generated by the movement of the XY stage itself.

Moreover, the passive vibration-absorbing systems described above must strike a good balance between insulation from vibrations propagated through the floor of the apparatus, which is to say vibration-free performance, and the ability to suppress vibration due to movement of the XY stage itself, that is, damping performance.

In recent years, an active damping system has been suggested, in which, in order to prevent the reaction torque to the driving of the XY stage from forcibly vibrating the isolation table, a counter-mass is driven in a direction opposite to the direction in which the stage is driven, so as to offset the drive reaction torque by the movement of the load so that vibrations do not reach the isolation table, the object being to provide a trade-off between vibration-free and vibration damping performance.

An example of the structure of a conventional active damping device is shown in FIG. 1. The active damping device shown here is designed so that three separate control units, consisting of controllers 31–41 for air spring supports 1, 8, controllers for the stage 18–22, and counter-mass drive controllers 25–29, operate independently. Hereinafter, for convenience, a direction in which a stage 16 is driven defines the X axis, a direction vertical thereto is the Z axis, a direction through the center of gravity of an isolation table 15 orthogonal to a direction of movement of the stage 16 is the Y axis and an axis of rotation around the Y axis the ($\omega$Y) axis.

The isolation table 15, which mounts the stage 16 and a counter-mass 23, is supported by air spring supports 1, 8. The air spring supports 1, 8 have air springs 3, 10, pressurized mechanical springs 5, 12, and viscosity elements 6, 13 for attenuating viscosity in order to eliminate vibration from the floor. Servo-valves 2, 9 control the supply and exhaust of air, which is the fluid body that operates the air springs 3, 10. Movement of the air springs is monitored by position sensors 4, 11 so as to measure changes in the position of the isolation table 15. The detection readings from the position sensors 4 and 11 are input to displacement amplifiers 30 and 31, respectively, and from the displacement amplifiers 30 and 31 are input to a displacement analyzer 32. The displacement analyzer 32 then analyzes the readings into a vertical (Z axis) displacement element component and a rotational displacement ($\omega$Y) component about the Y axis using calculations on a 2×2 matrix having as its elements the displacement and rotation (angle of rotation) of the air springs 3, 10, with the vertical and rotational displacement components forming negative feedback for calculating a deviation signal to be input to PI compensators 33, 34.

Next, acceleration readings of the isolation table 15 measured by acceleration sensors 7, 14 are input to an acceleration analyzer 37 after having been fed respectively through each of filters 35 and 36, which have predetermined appropriate gain and time constants. The acceleration analyzer 37 then analyzes the acceleration readings into a vertical (Z axis) acceleration component and a rotational ($\omega$Y axis) component about the Y axis, using the two inputs from the acceleration sensor 7, 14, with the vertical and rotational displacement components forming negative feedback for calculating a deviation signal to be input to a thrust allocator 38.

A target position setting unit 41 then sets a target position for the displacement of the isolation table 15 in the vertical and rotational directions, with a deviation signal between the set target value and the displacement analyzer 32 output signal being input to the PI compensators 33, 34. The deviation signal between the PI compensators 33, 34 output signals and the acceleration analyzer 37 output signal are then input to the thrust allocator 38.

The thrust allocator 38 then allocates command values for controlling the air springs in the vertical (Z axis) direction and the rotational ($\omega$Y) direction about the Y axis as drive command values for the air springs 3 and 10. The drive command values so allocated are each converted into drive currents by the amplifiers 39 and 40 and by the servo valves 2 and 9 adjusting the pressure inside the air springs 3 and 10 so that the isolation table 15 can be held at a desired position set by the target position setting unit 41 without steady-state deviation.

The PI compensators 33 and 34 each acts as displacement control compensators in the vertical direction (that is, along the Z axis) and in the rotational direction about the Y axis (that is, along the $\omega$Y axis), respectively. (The "P" element of the PI compensator proportionally calculating the extent of adjustment, the "I" element compensating so as to perform integral calculations with respect to the extent of adjustment.)

The foregoing comprises control of the air spring supports 1, 8 for the isolation table 15.

Position readings from a position sensor 17 that measures horizontal displacement of the stage 16 mounted atop the isolation table 15 are input to a displacement amplifier 18. A deviation signal between the output signals from the displacement amplifier 18 and the output signals from an integrator 22 that integrates velocity readings output from a target velocity generator 21 and generates stage 16 target position data is then input to a PID compensator 19, so that the extent of adjustment amplified by the amplifier 20 is applied to the stage 16.

Here, the "D" element in the PID compensator 19 compensates so as to perform differential calculations. The stage 16 target position command is obtained by integrating the target speed generated by the target velocity generator 21 with the integrator 22, thus completing control of the stage 16.

Further, position readings from a position sensor 24 that measures horizontal displacement of the counter-mass 23 mounted on the isolation table 15 are input to a displacement amplifier 25. A deviation signal between the output signals of a displacement amplifier 25 and the output signals from an integrator 29 that integrates velocity readings output by a target velocity generator 28 and generates counter-mass 23 target position data is then input to a PID compensator 26, so that an extent of adjustment amplified by an amplifier 27 is applied to the counter-mass 23, thus completing drive control of the counter-mass 23.

FIGS. 2A, 2B, 2C, 2D, 2E and 2F are diagrams illustrating stage and counter-mass target values, velocity patterns and acceleration patterns.

FIGS. 2B and 2E show the time (the X axis) of the target velocity generated by the target velocity generators 21 and 28 with respect to the driving of the stage 16 and the counter-mass 23. The velocity pattern shown here is known as a trapezoidal velocity pattern, having (from left to right in the diagram) an acceleration region, a constant velocity region and a deceleration region.

FIGS. 2A and 2D show the target accelerations, which is a differential of the target velocity with respect to the driving of the stage 16 and the control counter-mass 23. As can be seen, in regions corresponding to the acceleration and deceleration regions shown in FIGS. 2B and 2E, the direction of acceleration is involved. In the constant velocity region, the acceleration is zero.

FIGS. 2C and 2F show the target position, which is an integral of the target velocity with respect to the driving of the stage 16 and the counter-mass 23. The position-controlled stage 16 and counter-mass 23 gradually approach the target positions (indicated by the dotted lines) and are positioned. The extent of the movement to these target positions matches the surface areas of the velocity patterns shown in FIGS. 2B and 2E.

The drive reaction torque arising during acceleration and deceleration of the stage 16 can be offset by driving the counter-mass 23 in the opposite direction from the stage 16, so that the drive reaction torque imparted to the isolation table 15 is negated by the moment change due to the load movement. As a result, the drive reaction torque caused by the driving of the stage 16 can be prevented from reaching the isolation table 15.

However, when the stage 16 and counter-mass 23 are initialized, that is, when the initial settings are installed or the control parameters updated, etc., the stage 16 and the counter-mass 23 must be driven independently. But when the stage 16 and the counter-mass 23 are driven independently, the drive reaction torque and load movement moment so generated are not offset but are transmitted directly to the isolation table 15 as external forces. Moreover, if the stage 16 and the counter-mass 23 are moved at high speed, the isolation table 15 is agitated by the drive reaction torque and the load movement-generated moment and may exceed permissible drive range limits.

In order to prevent such over-extended movement of the isolation table 15, the stage 16 and the counter-mass 23 can be driven at a reduced speed so as to achieve the desired initializations. However, when employing an active damping apparatus in a semiconductor exposure apparatus to isolate the stage, the impact of the above-described initializations can result in reduced through-put of the apparatus.

SUMMARY OF THE INVENTION

Accordingly, the present invention has been conceived in light of the foregoing considerations, and has as its object to provide an improved active damping apparatus with superior damping performance, and an exposure apparatus employing such an improved active damping apparatus.

The above-described object of the present invention is achieved by an active damping apparatus comprising:

an isolation table mounting a stage and a counter-mass;

an isolation table controller operatively connected to the isolation table for supporting the isolation table and adjusting a position and attitude of the isolation table;

a setting unit operatively connected to the controller and adapted to select a combination of the stage and/or the counter-mass to be driven and to set a drive control mode according to what is to be driven; and a control input switch operatively connected to the setting unit and adapted to select a control loop that inputs into the isolation table controller a control target value for adjusting the drive of that which is to be driven according to the drive control mode selected by the setting unit, the active damping apparatus damping vibration by driving the stage and/or counter-mass mounted on the isolation table so as to offset drive reaction torque and counter-mass movement moment.

The above-described object of the present invention is also achieved by an exposure apparatus comprising:

a substrate stage;

the active damping apparatus described above; and a projective optical system for projecting a pattern onto the substrate.

The above-described object of the present invention is also achieved by a device manufacturing method comprising the steps of:

coating a substrate with a photosensitive agent;

exposing the substrate using the exposure apparatus described above; and developing the substrate.

Other objects, features, effects and advantages of the present invention will be apparent from the following description, taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention, in which.

DETAILED DESCRIPTION OF THE PREFERRED EMBODIMENTS

Preferred embodiments of the present invention are described in detail in accordance with the accompanying drawings.

(First Embodiment)

Figure 3:
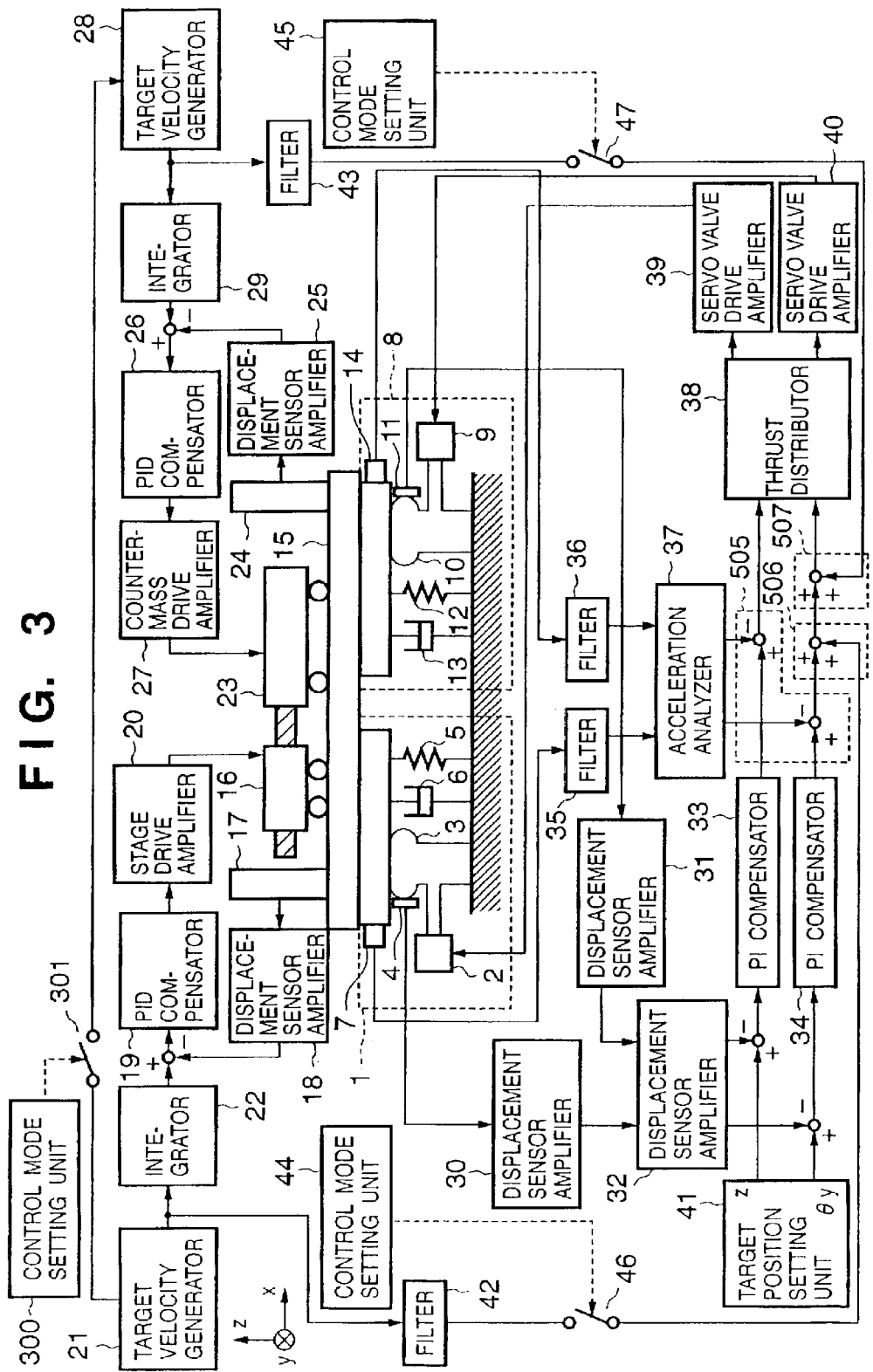
FIG. 3 is a block diagram illustrating the structure of an active damping apparatus according to a first embodiment of the present invention.
Figure 4:
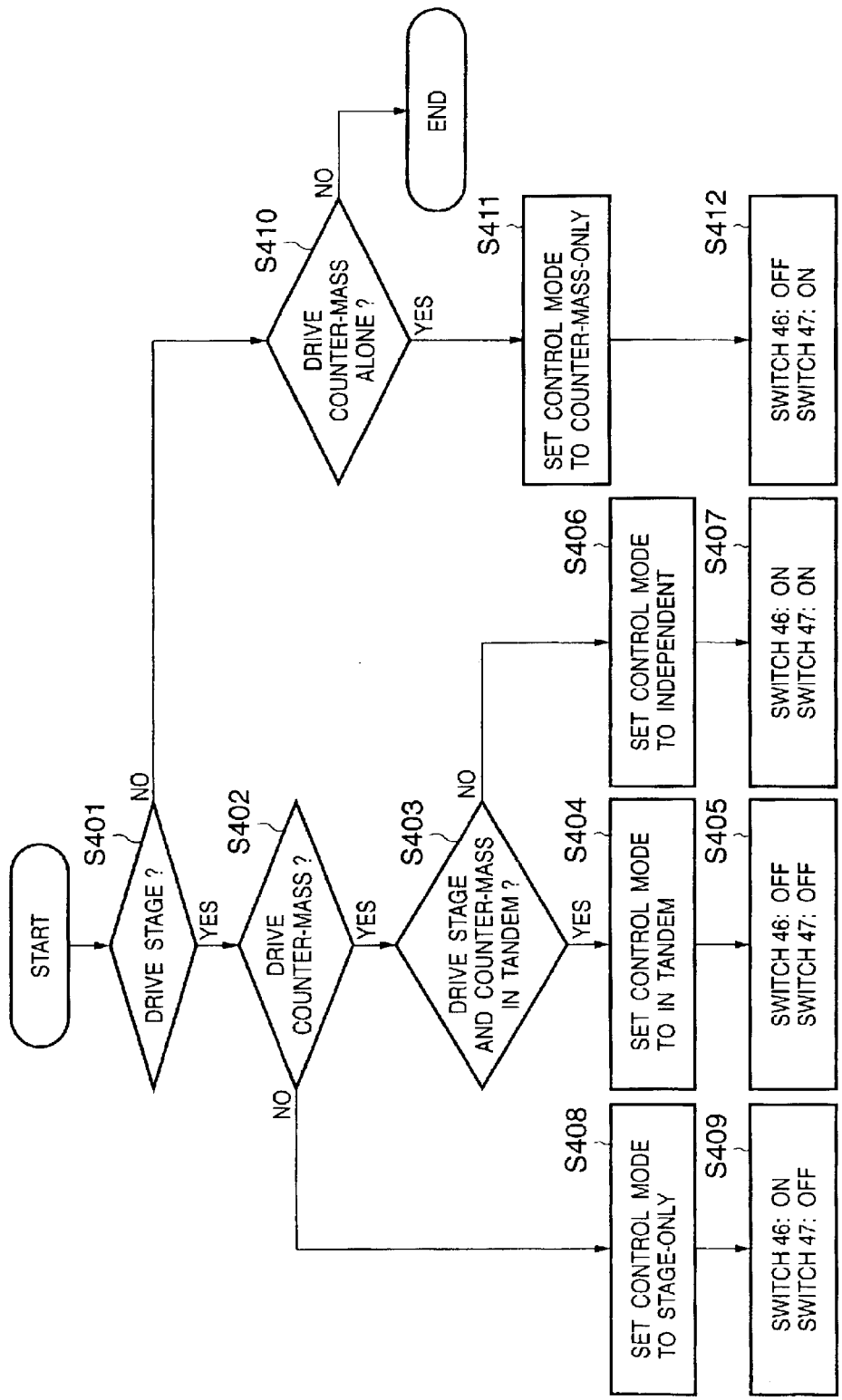
FIG. 4 is a flow chart illustrating drive control mode settings for the active damping apparatus according to the first embodiment.

A description is given of a first embodiment of the present invention, with reference initially to FIGS. 3 and 4.

Figure 1:
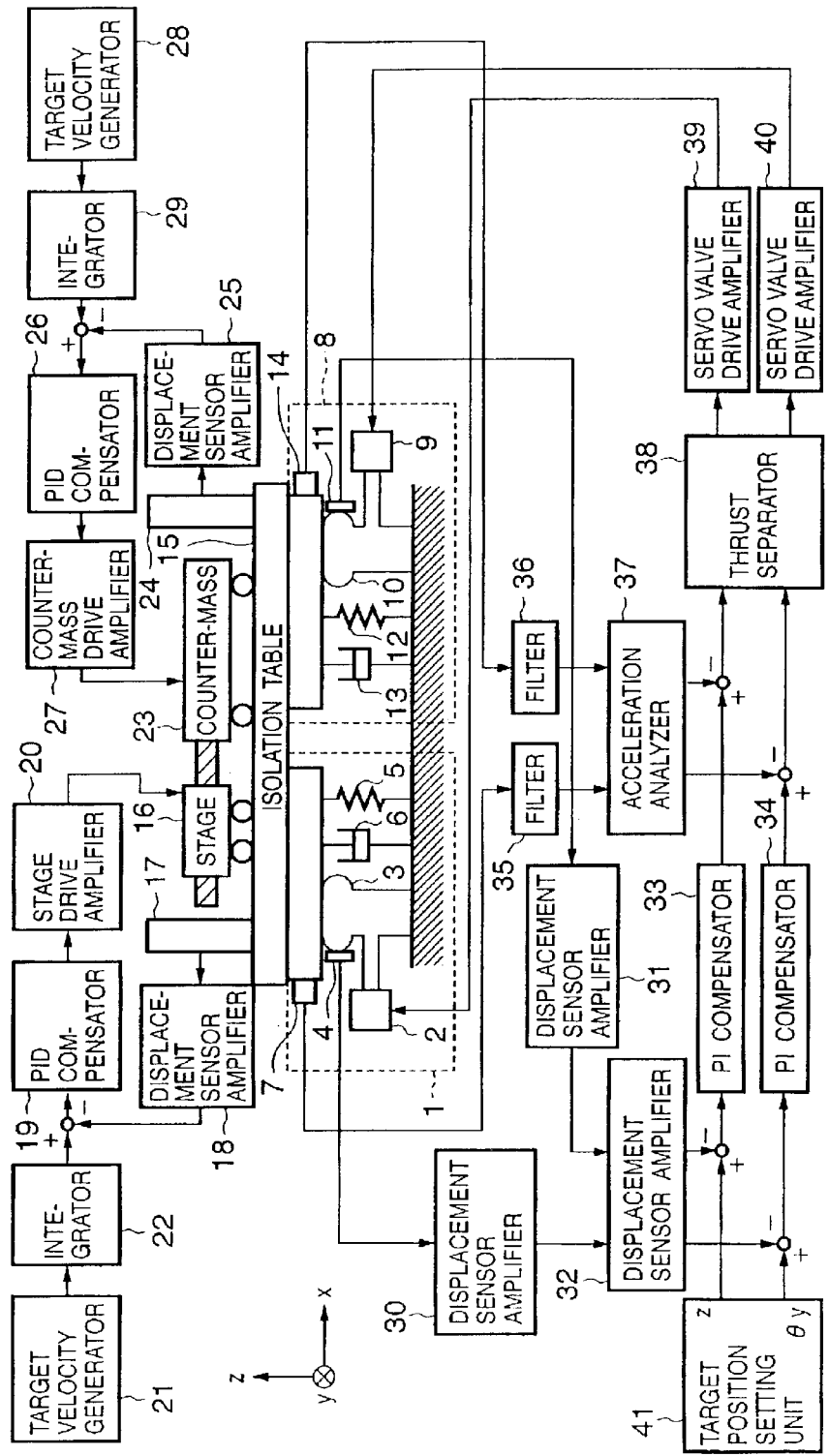
FIG. 1 shows an example of the structure of a conventional active damping device.
Figure 2:
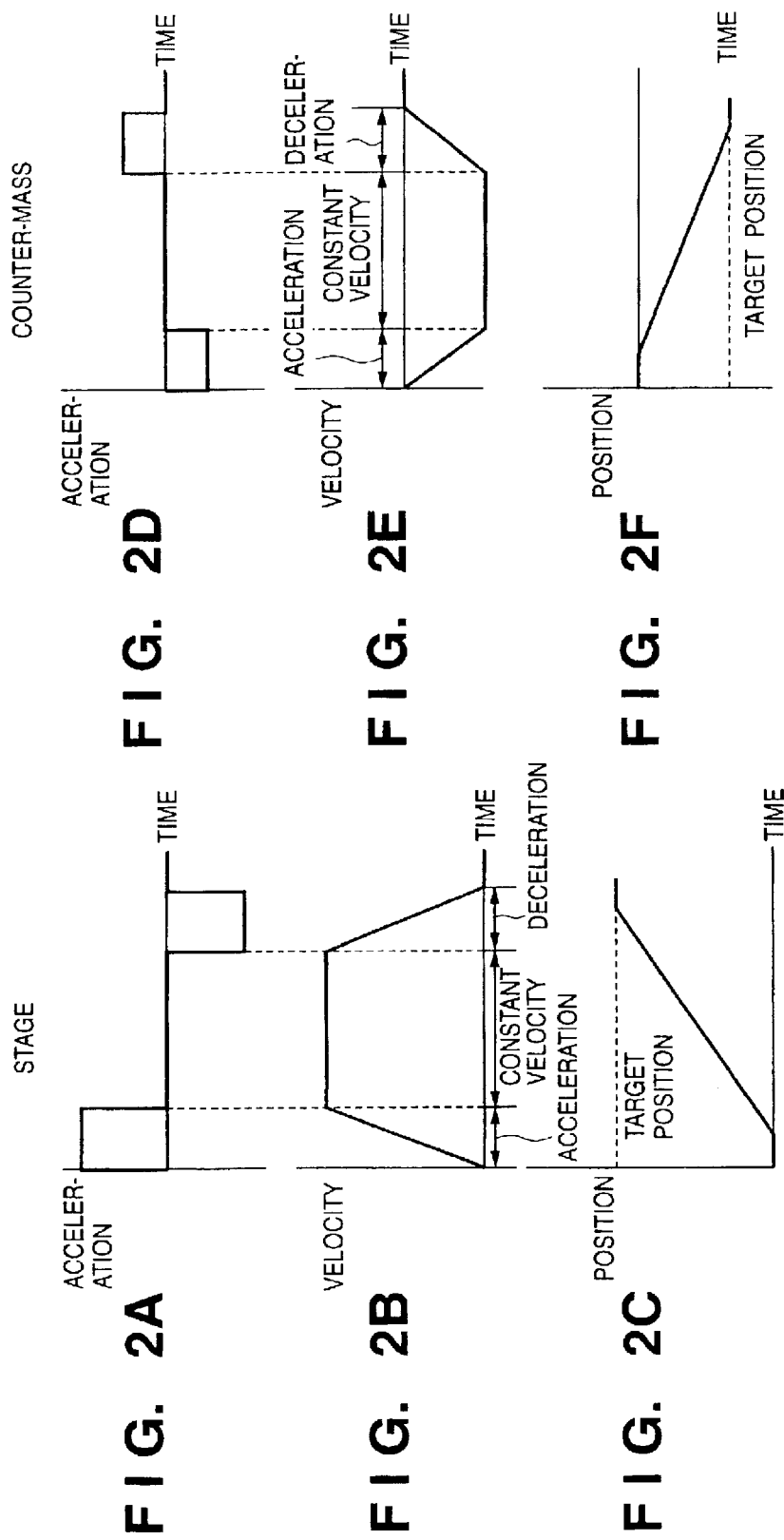
FIGS. 2A, 2B, 2C, 2D, 2E and 2F are diagrams illustrating stage and counter-mass target values, velocity patterns and acceleration patterns.

FIG. 3 is a block diagram illustrating the structure of an active damping apparatus according to a first embodiment of the present invention, with identical reference numerals denoting elements identical to those shown in the active damping apparatus of FIG. 1.

FIG. 4 is a flow chart illustrating drive control mode settings for the active damping apparatus according to the first embodiment. That which is to be driven (the stage and the counter-mass, or one of these) is set and the type of control to be conducted by the active damping apparatus is determined. When the stage 16 atop the isolation table 15 is to be moved (that is, YES at a step S401), the apparatus determines whether or not the counter-mass 23 is to be driven together with the stage 16 (step S402). If the counter-mass 23 is not to be driven with the stage 16 (that is, NO at step S402), the process proceeds to a step S408, setting the control mode to "stage-only drive". Switch 46 shown in FIG. 3 is turned ON and switch 47 shown in FIG. 3 is turned OFF (step S409). Switches 46 and 47 will be described in greater detail later.

If it is determined in step S402 that the counter-mass 23 is also to be driven along with the stage 16 (that is, YES in step S402), and that driving is to offset a drive reaction torque generated by the driving of the stage 16 (a state hereinafter referred to as "in tandem"), that is, YES at step S403, then the process proceeds to a step S404 and the control mode is set to "in tandem". In this case, both switch 46 and switch 47 of FIG. 3 are turned OFF (step S405). At this time, a control mode setting unit 300 shown in FIG. 3 activates a switch 301, turning switch 301 ON and inputting a control signal (including a target velocity) for driving the stage 16 into the target velocity generator 28 for driving the counter-mass 23.

If in step S403 it is determined that the driving of the counter-mass 23 is not to be linked with that of the stage 16 but that each is to be driven independently of the other and by separate commands, then the control mode is set to "independent drive" (step S406). In this case, switch 46 (shown in FIG. 3) is turned ON and switch 47 (also shown in FIG. 3) is also turned ON (step S407). At this time, the control mode setting unit 300 shown in FIG. 3 turns switch 301 OFF so that a target velocity for the stage 16 is not input into the counter-mass 23 control system.

If in step S401 it is determined that the stage is not to be driven (that is, NO at step S401) and that the counter-mass 23 alone is to be driven (that is, YES at S410), then the control mode is set to "counter-mass only" (step S411), and switch 46 is turned OFF and switch 47 is turned ON (step S412).

If in step S410 it is determined that the counter-mass 23 is not to be driven, (that is, NO at step S410), then the process ends.

As described above, the active damping apparatus can selectively be set to one of four different control modes according to what is to be driven and can switch the configuration of the control loop. What executes the control mode setting are the control mode setting units 44, 45 and 300, and this type of overall control is itself managed by a CPU, which is not shown in the diagrams. The control modes set by the process shown in FIG. 4 turn switches 46, 47 and 301 ON and OFF as appropriate. Shown in FIG. 3 is a stage in which the switches 46, 47 and 301 are turned OFF. In such a state, control signals for the stage 16 and the counter-mass 23 are not reflected in the disposition of the air springs control system, nor are control signals exchanged between the stage 16 and the counter-mass 23.

When the switches are turned ON, target velocities generated by the target velocity generators 21, 28 for driving the stage 16 and the counter-mass 23 are feed-forwarded into adding points 506, 507 of the control system for the air springs via filters 42 and 43.

The control signals generated by the target velocity generator 21 are input to the target velocity generator 28 that drives the counter-mass 23.

A description is now given of control of the set control mode, with reference initially to FIGS. 5A, 5B, 5C and 5D.

FIGS. 5A, 5B, 5C and 5D are control block diagrams showing schematically the connection structures of the control loop in the case of four different mode settings, specifically, mode settings in which (A) the stage and the counter-mass are driven in tandem, (B) the stage is driven independently, (C) the counter-mass is driven independently, and (D) the stage and the counter-mass are both driven, though independently of each other, respectively.

(Stage and counter-mass in tandem mode (S404))

The control modes set according to the process depicted in the flow chart described above control the settings of the switches, so that the control loops of the active damping apparatus are reconfigured according to the control mode by these switch settings.

Figure 5A:
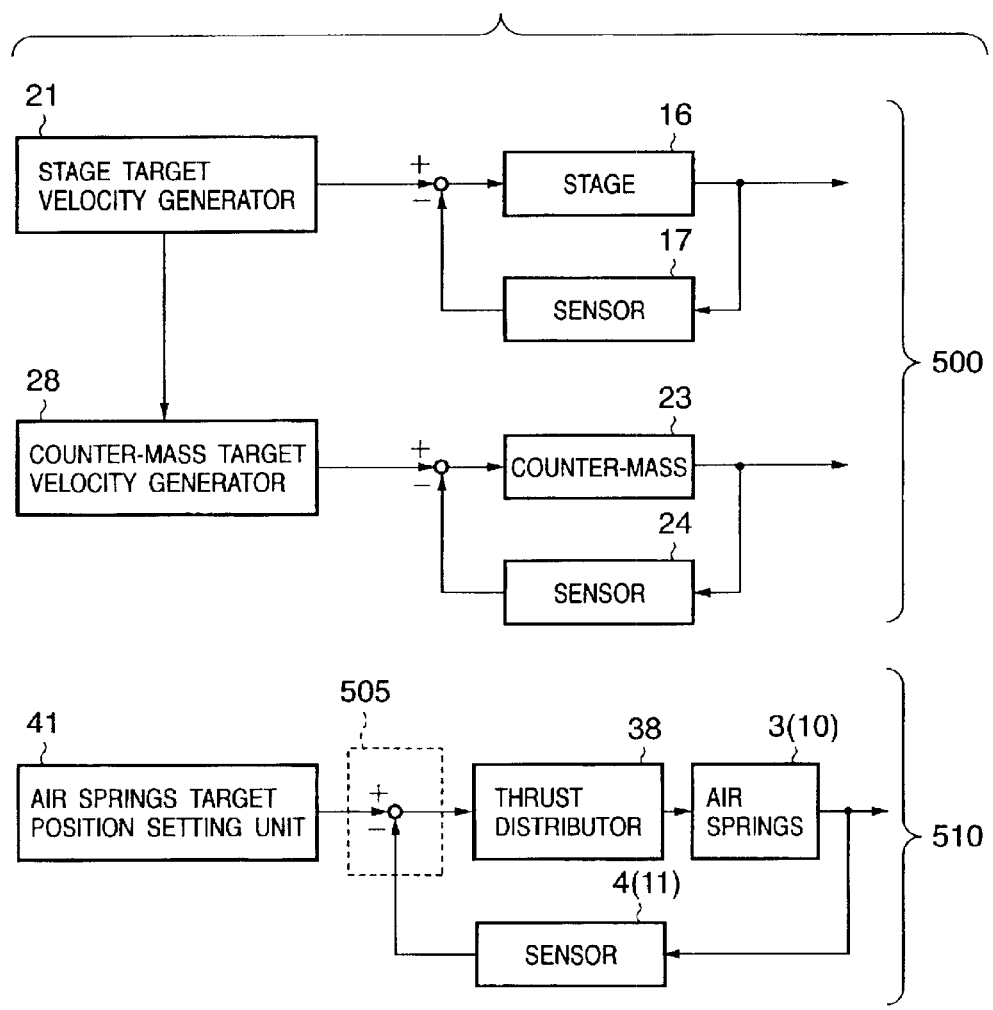
FIGS. 5A, 5B, 5C and 5D are control block diagrams showing schematically the connection structures of the control loop in the case of four different mode settings, specifically, mode settings in which (A) the stage and the counter-mass are driven in tandem, (B) the stage is driven independently, (C) the counter-mass is driven independently, and (D) the stage and the counter-mass are both driven independently of each other.

FIG. 5A is a block diagram showing schematically the connections of the control loop when the in-tandem mode is set in step S404. In the diagram, reference numeral 500 indicates schematically the structure of the control loop of the stage 16 and the counter-mass 23, and reference numeral 510 indicates schematically the control loop of the air springs 3 (10). The control mode setting unit 300 shown in FIG. 3 controls switch 301 and the target velocity generated by the target velocity generator 21 is input to the target velocity generator 28 for the counter-mass.

The input of such a target velocity causes a target value for accomplishing a movement that generates a force that offsets the drive reaction torque generated by the driving of the stage 16 to be generated by the target velocity generator 28 and input to the counter-mass 23.

The offsetting of the drive reaction torque, for example, in a case in which a thrust F at the stage 16 is transmitted to the isolation table 15, involves an offset force -F generated by the driving of the counter-mass 23, such that the sum total of the two forces is zero. This relation holds not just for a translational direction force, but also for the rotational direction moment, with the counter-mass control loop operating so that the moment sum total is zero. So when the drive reaction torque is fully offset by the linked motion of the stage and the counter-mass, the stage can be settled at its target position unaffected by any residual vibration.

In the in-tandem control mode, switches 46 and 47 are OFF, so in the control loop for adjusting the air springs there are no control commands input from the stage and the counter-mass. As a result, the air spring target position setting unit 41 controls the positioning of the air springs 3 (10) by executing independent control loops for the stage and the counter-mass.

(Stage alone driven, independently (S408))

Figure 5B:
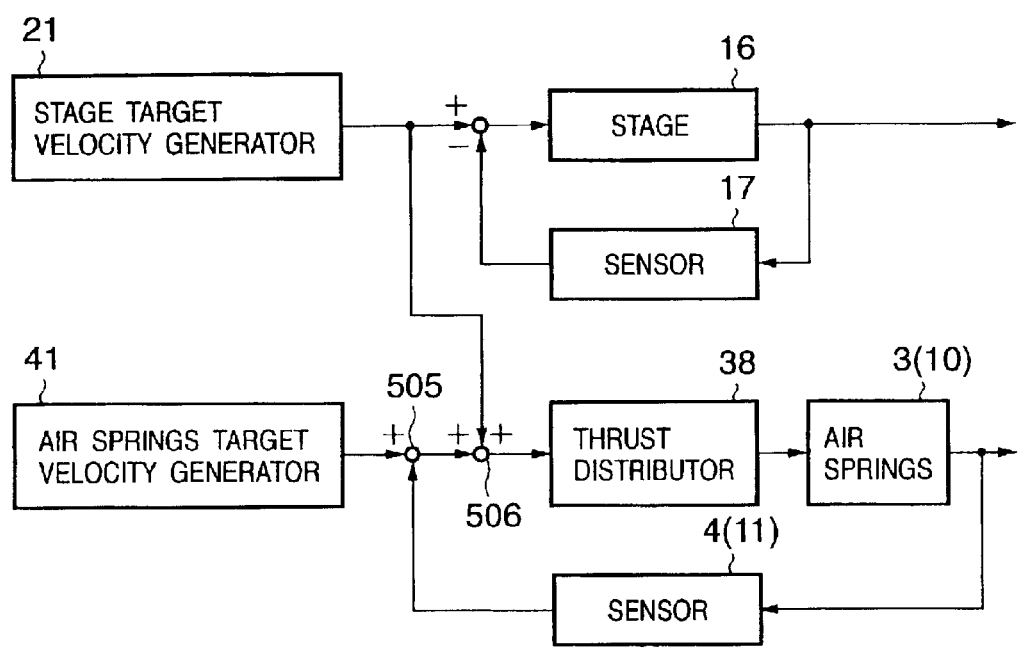

FIG. 5B is a block diagram showing schematically the connections of the control loop when only the stage is set to be driven, in step S408. (For simplicity, the displacement amplifier 18, PID compensator 19 and integrator 22 have been omitted from the drawing.) The control mode setting unit 300 shown in FIG. 3 turns switch 301 OFF, dividing the control loop so that stage 16 target values are not input to the counter-mass 23 side. The target value generated by the stage target velocity generator 21 is input to the stage 16 and that drive data is detected by the position sensor 17 and fed back to the control loop.

The control mode setting unit 44 of FIG. 3 turns switch 46 ON, inputting the target value generated by the stage target velocity generator 21 to the air springs. The air springs 3 (10) control system is formed by a control loop consisting mainly of air spring target position setting unit 41 and sensor 4 (11) and thrust distributor 38. (For simplicity, displacement amplifiers 30, 31, PI compensators 33, 34, amplifiers 39, 40 and filter 42 have been omitted from the drawing.)

At this time, the target value generated by the target velocity generator 21 is input both to the integrator 22 (shown in FIG. 3) that forms the control loop for the stage as well as to the filter 41 (shown in FIG. 3). The stage target velocity data passed through the filter 42 is input to the control mode setting unit 44 and, via switch 46, to the control unit for the air spring supports 1, 8 (506).

Figure 6:
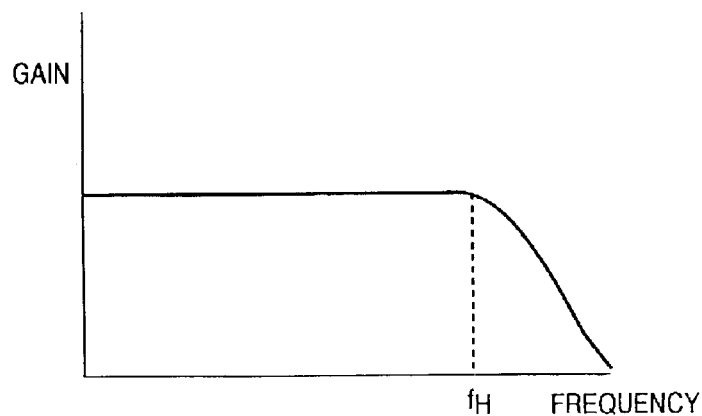
FIG. 6 shows filter frequency response characteristics for the first embodiment.

FIG. 6 shows frequency response characteristics of the filter for the first embodiment. The filter shown is a low-pass filter with a cut-off frequency of fH. A high-frequency component of a generated target velocity is cut off by passing through the filter, and thus rapid changes in input can be prevented from reaching the isolation table 15 air springs even when the stage 16 and counter-mass 23 target velocity changes discontinuously. In the present embodiment, the filter 42 for the stage target velocity and the filter 43 for the counter-mass target velocity are given the same cut-off frequency. However, it is possible to have different cut-off frequencies for the two filters and still achieve the object of the present invention.

In a state of equilibrium, the transfer function for the air springs where the servo valve input current is I and the air spring pressure is P can be approximated by the integral characteristics given in the following formula:

$$\frac{P}{I} = G_q \frac{kP_0}{V_0 s} \quad (1)$$

where Gq is the servo valve flow gain, k is the ratio of specific heat, P0 is the spring pressure in a state of equilibrium, V0 is the air spring capacity in a state of equilibrium and s is the Laplace operator.

Therefore, the target velocity of the stage that is feed-forwarded into the control system for rotational displacement about the Y axis of the isolation table 15 (ωY axis) is integrated using the integral characteristics of the air springs formula (1), with the feed forward of the target velocity being equivalent to applying a rotational moment to the isolation table 15 that is proportional to the position of the stage 16.

The feed-forward of the target velocity allows the thrust distributor 38 to generate at the air springs 3, 10 a support moment for offsetting the rotational moment generated by the movement of the stage 16. The position of the air springs is detected by the position sensors 4, 11 and the detection readings are fed back to the adding point 505 via the displacement amplifiers 30, 31, the displacement analyzer 32, and the PI compensators 33, 34.

In other words, even when the stage 16 alone is driven independently, data concerning the drive control for the stage 16 is input to the air springs control loop and the output of the air springs can be adjusted according to the stage drive data. Accordingly, when the stage 16 alone is driven, vibration of the isolation table can be dampened by coordination with the air springs control.

(Counter-mass alone driven, independently (S411))

Figure 5C:
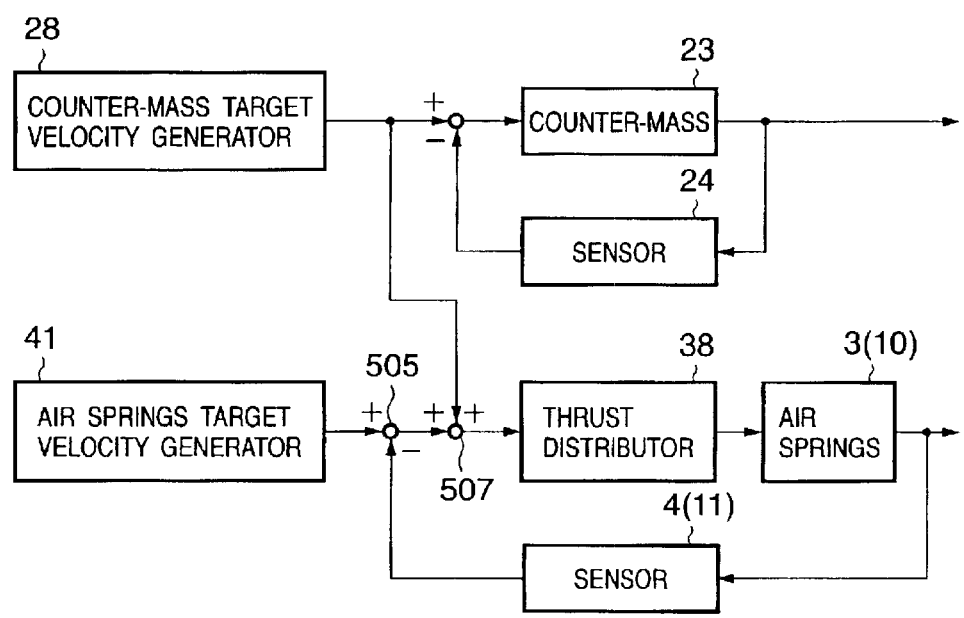

FIG. 5C is a control block diagram showing schematic connections of the control loop when the counter-mass alone is set to be driven (step S411). (For simplicity, the displacement amplifier 25, PID compensator 26, integrator 29, etc., have been omitted from FIG. 5C.) The control mode setting unit 300 of FIG. 3 turns switch 301 OFF. Therefore, the counter-mass 23 is driven according to the target value generated by the target velocity generator 28, that position is detected by the position sensor 24 and fed back to the control loop.

The control mode setting unit 45 (shown in FIG. 3) turns switch 47 ON, inputting the target value generated by the target velocity generator 28 to the air springs control system. The air springs 3 (10) control system is substantially identical to that shown in FIG. 5B, and forms a control loop composed of target position setting unit 41, position sensors 4 (11) and thrust distributor 38. (For simplicity, the displacement amplifiers 30, 31, PI compensators 33, 34, amplifiers 39, 40 and filter 43 have been omitted from FIG. 5C.)

At this time, the target velocity generated by the target velocity generator 28 is input both to the integrator 29 (shown in FIG. 3) that forms the control loop for the counter-mass 23 as well as to the filter 43 (shown in FIG. 3). As described above, this filter 43 has the particular frequency response shown in FIG. 6, such that counter-mass 23 target velocity that has been filtered by this filter 43 is input to the air springs control loop via the control mode setting unit 45 and the switch 47.

The filter 43, as shown in FIG. 6, is a low-pass filter with a cut-off frequency of fH. The cut-off frequency may be set to be either different from or the same as that of filter 42.

The air springs transfer function, as described above with respect to formula (1), has an integral characteristic, so the counter-mass 23 target velocity that is feed-forwarded into the control system for the rotational displacement about the Y axis of the isolation table 15 (that is, the ωY axis) is integrated by the integral characteristic of the air springs according to formula (1), with the feed forward of the target velocity being equivalent to applying a rotational moment to the isolation table 14 that is proportional to the position of the stage 16.

The feed-forward of the target velocity allows the thrust distributor 38 to generate at the air springs 3, 10 a support moment for offsetting the rotational moment generated by the movement of the counter-mass 23. The position of the air-springs is detected by the position sensors 4, 11 and the detection readings are fed back to the adding point 505 via the displacement amplifiers 30, 31, the displacement analyzer 32 and the PI compensators 33, 34.

Accordingly, when the counter-mass 23 alone is driven, vibration of the isolation table can be dampened by coordination with the air springs controller.

(Mode in which both the stage and the counter-mass are driven independently of each other (step S406))

Figure 5D:
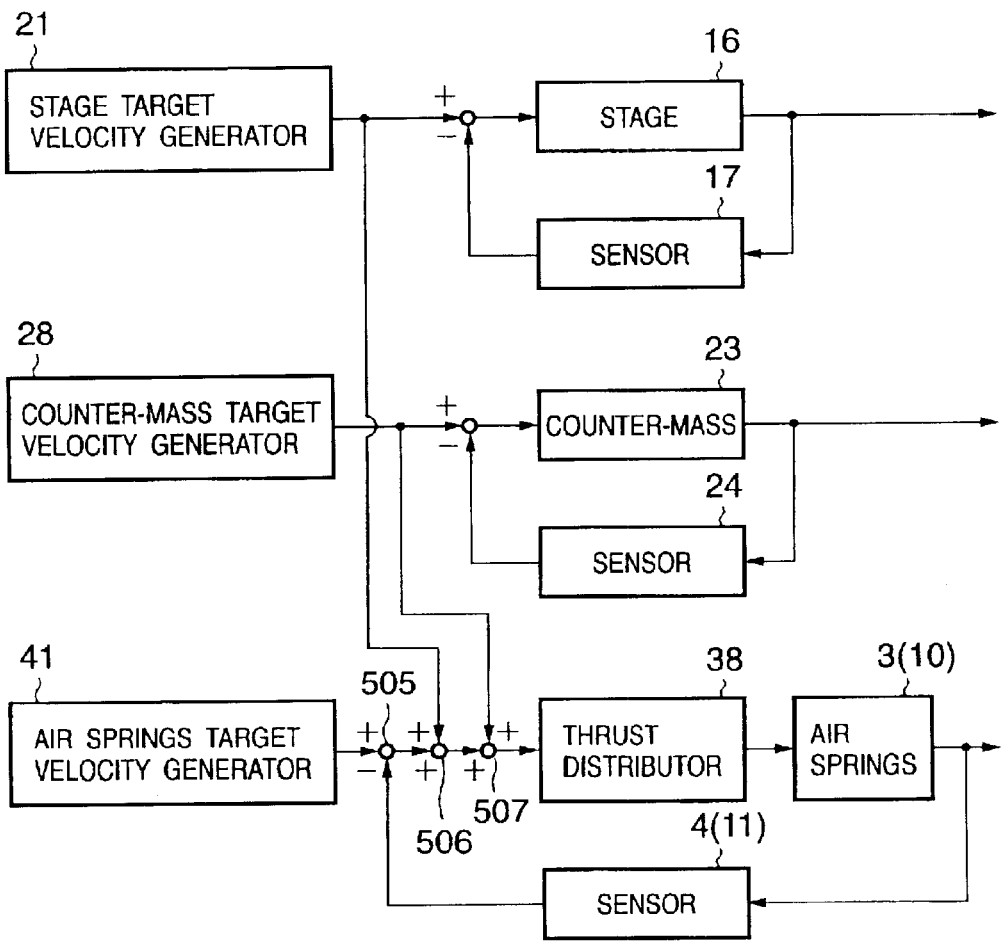

FIG. 5D is a block diagram indicating schematic connections in a control loop when a mode is set in which both the stage and the counter-mass are to be driven, though independently of each other. In such a case, the control mode setting unit 300 of FIG. 3 turns switch 301 OFF, dividing the control loop so that no stage target velocity is input to the counter-mass 23 side.

The control mode setting unit 44 (shown in FIG. 3) turns switch 46 ON, inputting the target value generated by the target velocity generator 21 to the air springs control system. The air springs 3 control system consists substantially of the control loop formed by the target position setting unit 41 for the air springs, position sensors 4 (11) and thrust distributor 38. (As with FIGS. 5B and 5C, for simplicity, the displacement amplifiers 30, 31, PI compensators 33, 34, amplifiers 39, 40 and filter 42 have been omitted from FIG. 5C.)

In addition, the control mode setting unit 45 (shown in FIG. 3) turns switch 47 ON, inputting the target value generated by the target velocity generator 28 to the air springs control system.

Stage 16 target velocity is input to the controller for the air springs control system via the control mode setting unit 44 and the switch 46 (506). In addition, the counter-mass 23 target velocity is input to the controller for the air springs control system via the control mode setting unit 25 and the switch 47 (507).

The feed-forward input of the target velocity enables the air springs control system to absorb the impact of the rotational moment generated by the movement of the stage 16 and the counter-mass 23.

Accordingly, vibration of the isolation table when the stage 16 or the counter-mass 23 alone is driven can be dampened by coordination with the air springs controller.

As described above, by switching input to the isolation table controller of the control target values for the stage and the counter-mass according to that which is to be driven, the active damping apparatus according to the first embodiment of the present invention, makes it possible to dampen vibration of the isolation table 15 when driving either the stage and/or the counter-mass separately or independently.

(Second Embodiment)

Figure 7:
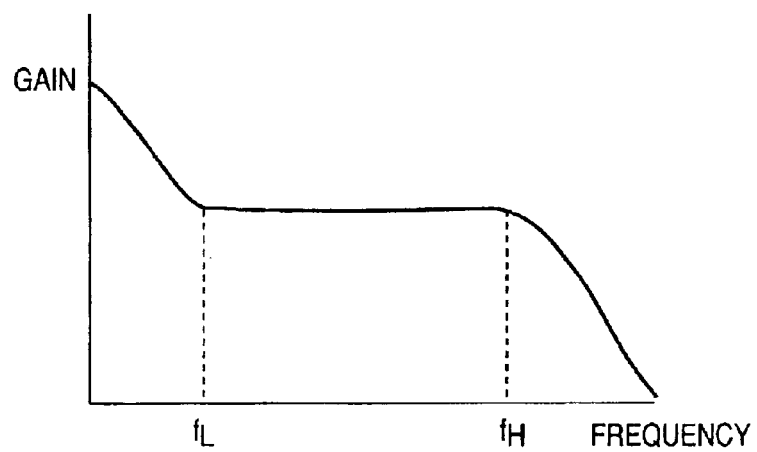
FIG. 7 shows filter frequency response characteristics for a second embodiment.

A description is now given of an active damping apparatus according to a second embodiment of the present invention, with reference in the first instance to FIG. 7.

FIG. 7 shows filter frequency response characteristics for a second embodiment.

In the first embodiment described above, the air springs control system is given as the transfer function having the integral characteristic described by formula (1). However, an active damping apparatus having the structure depicted in FIG. 3 can also be adapted to a control system that approximates servo valve characteristics using a time lag of a first order system. If the filters 42 and 43 are given the frequency response shown in FIG. 7, the integral characteristic can be imparted to the transfer function for frequencies in the bands at or below frequency fL. That is, the feed-forward control target value makes it possible to reflect the integral at the air springs controller. In this case, the value of frequency fL in FIG. 7 may be set to be equal to the inverse of the time constant of the time lag of the first order system.

By using a filter having a frequency response like that shown in FIG. 7, even in a case in which, for example, the characteristics are such that the transfer function of the servo valves 2, 9 in the control system for the air springs 3, 10, is approximated by a time lag of a first order system, the integral element characteristic can be reflected in the control system. As a result, in the above-described control mode, isolation table vibration can be dampened according to the drive mode, that is, whether driving the stage 16 alone, the counter-mass 23 alone, or the stage 16 and counter-mass 23 independently.

Further, it should be noted that although the first and second embodiments described above have two vertical air spring supports that support the isolation table 15, the present invention is not limited to such an arrangement, but may use three or more such supports. In such a case, the isolation table position control system is composed of three separate control systems, for translational movement along the Z axis, rotational movement about the X axis and rotational movement about the Y axis. In such a case, 3×3 matrix computations are conducted at the displacement analyzer, the velocity analyzer and the thrust distributor, thus adapting position adjustment control to the setting mode.

The air springs that support the isolation table need not necessarily be disposed vertically but may additionally be mounted so as to drive the isolation table 15 horizontally. By mounting the air springs horizontally, horizontal vibration of the isolation table can be suppressed.

Also, an electromagnetic actuator may further be mounted in order to drive the isolation table 15 in the horizontal direction. By mounting an electromagnetic actuator that drives horizontally (along the X axis), the drive reaction torque that is generated when the stage 16 and the counter-mass 23 are driven independently is absorbed by the driving of the electromagnetic actuator, and it is also possible to coordinate the driving of the electromagnetic actuator with the air springs control system so as to offset vibration.

In addition, the movement of the stage and the counter-mass may be either within a two-dimensional flat plane like the XY stage or, when three air spring supports are provided in directions that include the vertical (that is, providing in FIG. 3 an additional air spring support on the Y-axis direction), by feed-forward of the target velocity of the XY stage and the counter-mass along the X axis to the control loop that controls ωY axis rotation of the air springs control system and by feed-forward of the target velocity of the XY stage and the counter-mass along the Y axis to the control loop that controls ωX axis rotational displacement of the air springs about the X axis. By so doing, vibration of the isolation table 15 can be dampened as described above with respect to control modes even when the XY stage and the counter-mass are set to move independently.

(Third Embodiment)

Figure 8:
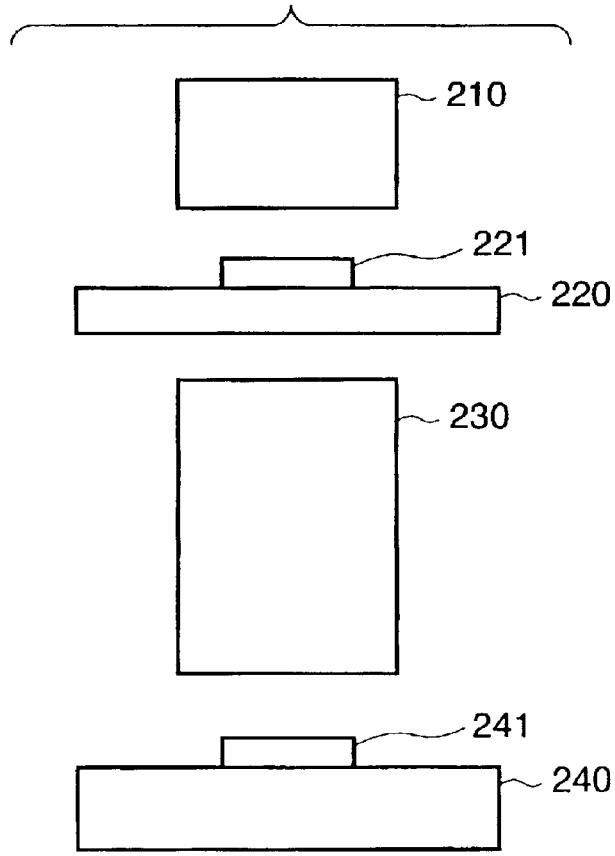
FIG. 8 is a schematic diagram of an exposure apparatus employing the active damping apparatus of the preferred embodiments of the present invention.

A description is now given of a third embodiment of the present invention, with reference initially to FIG. 8.

FIG. 8 is a schematic diagram of an exposure apparatus employing the active damping apparatus of the preferred embodiments of the present invention.

In the exposure apparatus shown in FIG. 8, a reticle mask 221 supported by a reticle mask stage 220 is illuminated by an illumination optical system and the reticle mask 221 pattern is projected by a projection optical system 230 onto a substrate 241 (that is, a wafer) atop a substrate (wafer) stage 240, exposing the wafer 241. Here, the wafer stage 240 employs the active damping apparatus shown in FIG. 3.

By using the active damping apparatus according to the present invention in the exposure apparatus, it is possible to reduce vibration attendant upon movement of the stage, to improve the overlay and line width precision and to increase through-put.

Additionally, it becomes possible to initialize the settings of the stage efficiently so as to improve the through-put of the exposure apparatus.

A description is now given of a device manufacturing method employing the above-described exposure apparatus equipped with the active damping apparatus according to the present invention for the manufacture of semiconductor devices.

Figure 9:
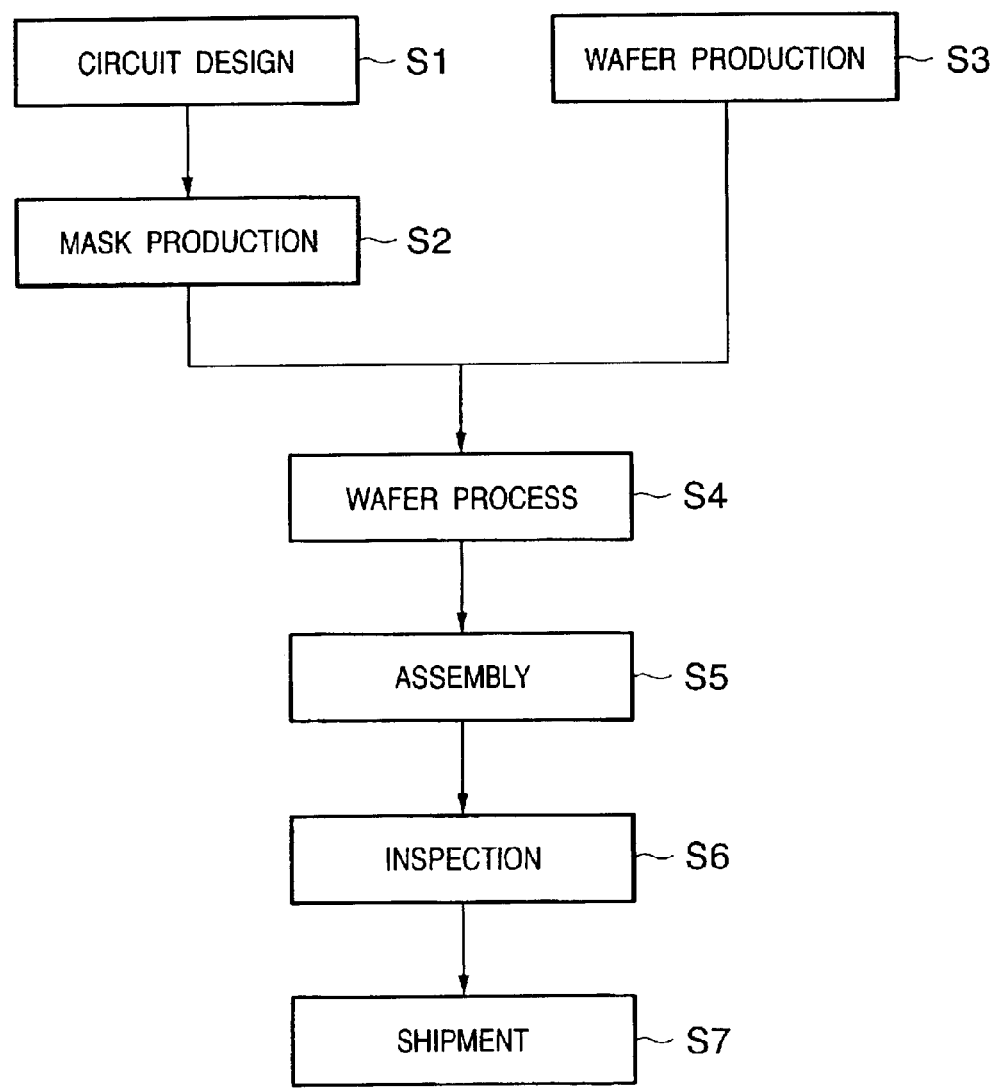
FIG. 9 is a flow chart of steps in the overall production process for manufacturing semiconductor devices.

FIG. 9 is a flow chart of steps in the overall production process for manufacturing semiconductor devices.

As shown in the diagram, a step S1 (circuit design) involves designing the circuit of the semiconductor device. A step S2 (mask production) involves producing a mask for the exposure device based on the circuit pattern designed in step S1.

Meanwhile, a step S3 (wafer production) involves producing a wafer using a material such as silicon, or the like. A step S4 (wafer processing), called pre-processing, and involves using the mask and housing prepared as described above and forming an actual circuit in the wafer by lithography. A succeeding step S5 (assembly), called post-processing, involves using the wafer produced in step S4 to make a semiconductor chip and includes such assembly processes as assembly (dicing, bonding) and packaging (sealing the chip). A step S6 (inspection) involves testing the operation and reliability of the semiconductor device produced in step S5. By such steps is a semiconductor device completed and, in a step S7, shipped to customers.

Figure 10:
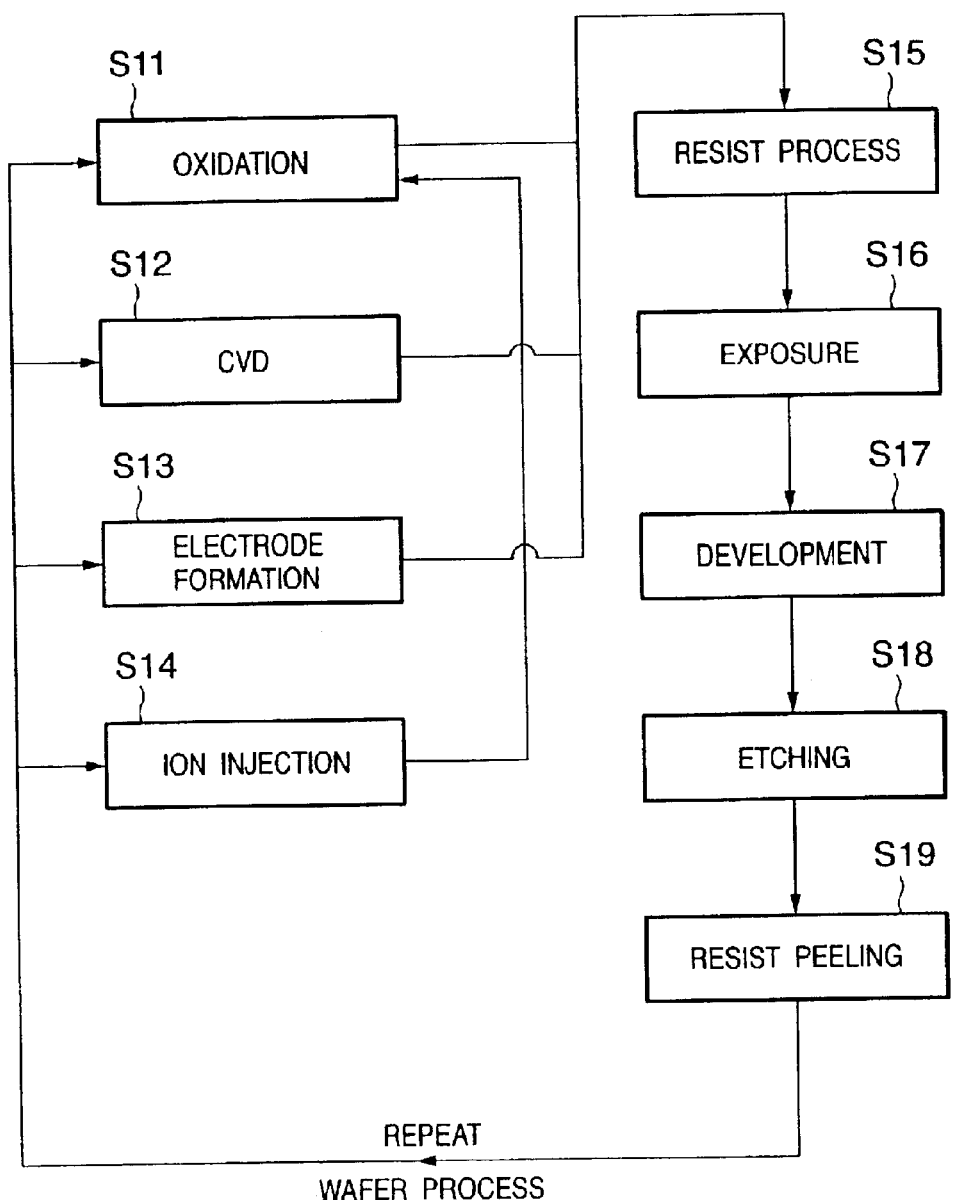
FIG. 10 is a flow chart of the overall wafer processing process.

FIG. 10 is a more detailed flow chart of the above-described wafer processing process using an exposure apparatus according to the present invention.

As shown in the diagram, in a step S11 (oxidation), the surface of the wafer is oxidized. In a step S12 (CVD), an insulating film is laid down over the surface of the wafer. In a step S13 (electrode formation), electrodes are vapor-formed on the wafer. In a step S14 (ion injection), the wafer is injected with ions. In a step S15 (resist process), the wafer is coated with a photosensitizer. In a step S16 (exposure), a circuit pattern is etched (exposed) on the surface of the wafer using the semiconductor exposure apparatus described above. In a step S17 (development), the exposed wafer is developed. In a step S18 (etching), everything but the developed resist image is scraped away. In a step S19 (resist peeling), the resist, which is no longer needed now that etching is completed, is removed. By repeating these steps, a multi-layered circuit pattern is formed on the wafer.

As described above, by switching input to the isolation table controller of the control target values for the stage and the counter-mass according to that which is to be driven, the active damping apparatus according to the present invention makes it possible to dampen vibration of the isolation table when driving either the stage and/or the counter-mass separately or independently.

The present invention is not limited to the above-described embodiments, and various changes and modifications can be made within the spirit and scope of the present invention. Therefore, in order to apprise the public of the scope of the present invention, the following claims are made.

What is claimed is:

1. An active damping apparatus comprising:
    an isolation table mounting a stage and a counter-mass;
    an isolation table controller operatively connected to the isolation table for supporting the isolation table and adjusting a position and an attitude of the isolation table;
    a setting unit operatively connected to the controller and adapted to select a combination of the stage and/or the counter-mass to be driven and to set a drive control mode according to what is to be driven; and
    a control input switch operatively connected to the setting unit and adapted to select a control loop that inputs into the isolation table controller a control target value for adjusting the drive of that which is to be driven according to the drive control mode selected by the setting unit,
    wherein the active damping apparatus damps vibration by driving the stage and/or counter-mass mounted on the isolation table so as to offset a drive reaction torque and a counter-mass movement moment.

2. The active damping apparatus according to claim 1, wherein, when the drive control mode is set so that only the stage is driven, the control input switch operates a first switch and connects the control loop so as to input into said isolation table controller a control target value for driving the stage.

3. The active damping apparatus according to claim 2, wherein, when the drive control mode is set so that only the counter-mass is driven, the control input switch operates a second switch and connects to the control loop so as to input into said isolation table controller a control target value for driving the counter-mass.

4. The active damping apparatus according to claim 3, wherein, when the drive control mode is set so that both the stage and the counter-mass are driven independently, the control input switch operates the first switch and the second switch and connects to the control loop so as to input into said isolation table controller a control target value for driving both the stage and the counter-mass independently.

5. The active damping apparatus according to claim 4, wherein, when the drive control mode is set so that both the stage and the counter-mass are driven in tandem, the control input switch:
    operates a third switch for inputting into a controller for driving the counter-mass a stage control target value and connects to a control loop; and
    operates the first switch and the second switch and disconnects from said isolation table controller.

6. The active damping apparatus according to claim 2, wherein, when the drive control mode is set so that only the stage is driven, the isolation table controller outputs, to a drive unit of said isolation table, a first adjustment amount for adjusting the position and/or attitude of said isolation table and a second adjustment amount for damping vibration of the stage according to a control target input via the first switch.

7. The active damping apparatus according to claim 3, wherein, when the drive control mode is set so that only the counter-mass is driven, said isolation table controller outputs, to the drive unit of said isolation table, a first adjustment amount for adjusting the position and/or attitude of said isolation table and a second adjustment amount for damping vibration of the counter-mass according to a control target value input via the second switch.

8. The active damping apparatus according to claim 3, wherein, when the drive control mode is set so that both the stage and the counter-mass are driven independently, said isolation table controller outputs, to said drive unit of said isolation table, a first adjustment amount for supporting and for adjusting the position and/or attitude of said isolation table, a second adjustment amount for damping vibration of the stage according to a control target value input via the first switch, and a third adjustment amount for damping vibration of said counter-mass according to a control target value input via the second switch.

9. The active damping apparatus according to claim 1, further comprising a filter that imparts a particular frequency response to the control target values for the stage and the counter-mass, such that the filtered control target values impart an integral response to a transfer function of said isolation table controller in a particular frequency domain.

10. The active damping apparatus according to claim 1, wherein said isolation table controller dampens vibration in a direction of rotation of said isolation table.

11. An exposure apparatus comprising:
a substrate stage;
the active damping apparatus of claim 1; and
a projection optical system for projecting a pattern onto the substrate.

12. A device manufacturing method comprising the steps of:
coating a substrate with a photosensitive agent;
exposing the substrate using the exposure apparatus of claim 11; and
developing the substrate.

13. An active damping apparatus comprising:
an isolation table adapted to mount a stage and a counter-mass; and
an isolation table controller operatively connected to said isolation table and adapted to adjust a position and an attitude of said isolation table,
wherein a target value of the stage and a target value of the counter-mass are input into said isolation table controller in order to adjust the position and attitude of said isolation table.

14. An active damping apparatus comprising:
an isolation table adapted to mount a stage and a counter-mass;
an isolation table controller operatively connected to said isolation table and adapted to adjust a position and an attitude of said isolation table;
a setting unit adapted to select the stage or the counter-mass as a controlling object to be moved independently; and
a switch adapted to input a target value, which is used for controlling the controlling object selected by said setting unit, into said isolation table controller.

* * * * *